(12) United States Patent
Yan et al.

(10) Patent No.: US 7,821,333 B2
(45) Date of Patent: Oct. 26, 2010

(54) HIGH-VOLTAGE DIFFERENTIAL AMPLIFIER AND METHOD USING LOW VOLTAGE AMPLIFIER AND DYNAMIC VOLTAGE SELECTION

(75) Inventors: Shoubao Yan, Tucson, AZ (US); Gerald W. Steele, Tucson, AZ (US); David R. Baum, Tucson, AZ (US)

(73) Assignee: Texas Instruments Incorporated, Dallas, TX (US)

(*) Notice: Subject to any disclaimer, the term of this patent is extended or adjusted under 35 U.S.C. 154(b) by 74 days.

(21) Appl. No.: 12/287,762

(22) Filed: Oct. 14, 2008

(65) Prior Publication Data

US 2009/0174479 A1 Jul. 9, 2009

Related U.S. Application Data

(60) Provisional application No. 61/019,023, filed on Jan. 4, 2008.

(51) Int. Cl.
*H03F 1/02* (2006.01)

(52) U.S. Cl. .......................................................... 330/9
(58) Field of Classification Search .................... 330/9; 327/124, 307
See application file for complete search history.

(56) References Cited

U.S. PATENT DOCUMENTS 7,518,440 B1 * 4/2009 Trifonov ......................... 330/9
7,535,295 B1 * 5/2009 Huijsing et al. ................ 330/9

* cited by examiner

*Primary Examiner*—Khanh V Nguyen
(74) *Attorney, Agent, or Firm*—John J. Patti; Wade J. Brady, III; Frederick J. Telecky, Jr.

(57) ABSTRACT

A differential amplifier (1D) includes circuitry (5,R1,R2,52) coupling a common mode component of an input voltage ($Vin^+$–$Vin^-$) to a maximum voltage selector circuit (53) that produces an internal voltage ($V_{RAIL-TOP}$) equal to the larger of a first supply voltage ($V_{REG}$) and the common mode component. An input amplifier circuit (46) of the differential amplifier is powered by the internal voltage. The input voltage ($Vin^+$–$Vin^-$) is coupled to inputs (41A,B) of the input amplifier circuit (46). Outputs (64A,B) of the input amplifier circuit (46) are amplified by an output amplifier (50).

20 Claims, 8 Drawing Sheets

HIGH-VOLTAGE DIFFERENTIAL AMPLIFIER AND METHOD USING LOW VOLTAGE AMPLIFIER AND DYNAMIC VOLTAGE SELECTION

CROSS REFERENCE TO RELATED APPLICATION

This application claims the benefit of prior filed U.S. provisional application Ser. No. 61/019,023 filed Jan. 4, 200, entitled "High-Voltage Differential Amplifier Topology Using Low Voltage Amplifier and Dynamic Voltage Selection", by Shoubao Yan, Gerald W. Steele, and David R. Baum, and incorporated herein by reference.

BACKGROUND OF THE INVENTION

The present invention relates generally to current shunt amplifiers, and more particularly to improving the common mode input range thereof well beyond the power supply voltage.

Figure 1:
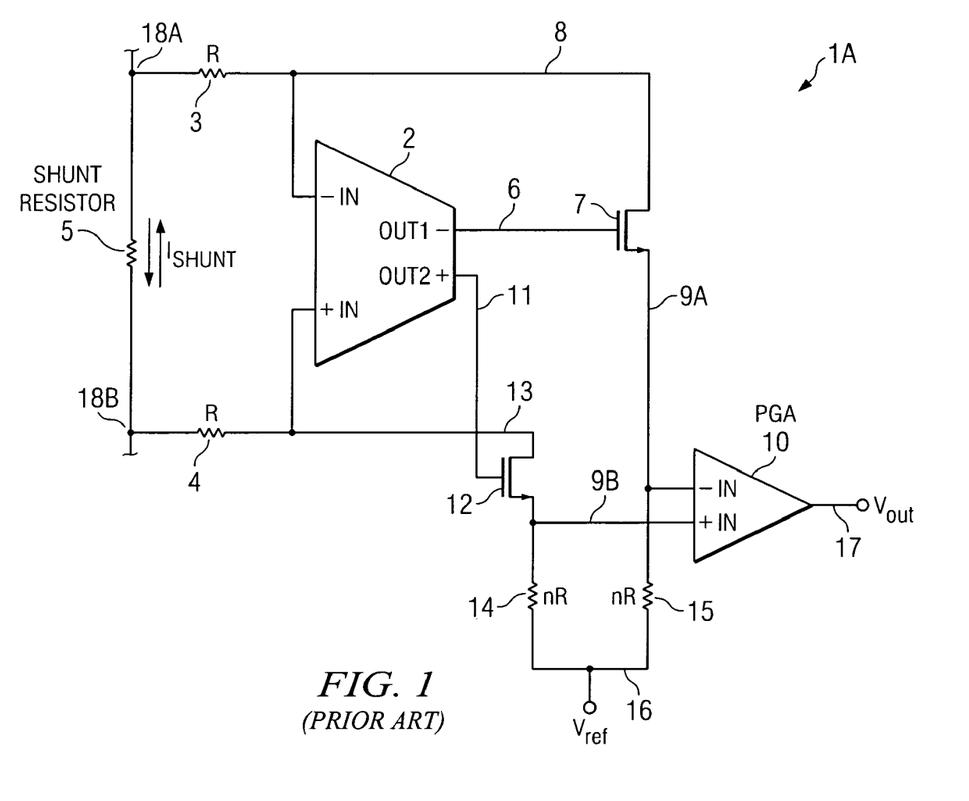
FIG. 1 is a schematic diagram of a prior art current shunt amplifier.

Referring to Prior Art FIG. 1, the illustrated current shunt amplifier 1A measures the voltage produced across an external shunt resistor 5. Current shunt amplifier 1A includes an operational amplifier 2 having its (−) input connected by a conductor 8 to one terminal of an input resistor 3 and to the drain of a N-channel output transistor 7. The other terminal of input resistor 3 is connected by conductor 18A to one terminal of shunt resistor 5. The (+) input of amplifier 2 is connected by conductor 13 to an terminal of input resistor 4 and to the drain of a N-channel output transistor 12. Another terminal of input resistor 4 is connected by conductor 18B to the other terminal of shunt resistor 5. The gate of output transistor 7 is connected by conductor 6 to a first output out1 of amplifier 2 and the gate of output transistor 12 is connected by conductor 11 to a second output out2 of amplifier 2. The source of output transistor 7 is connected by conductor 9A to the (−) input of an output amplifier 10 and to one terminal of a source follower resistor 15, the other terminal of which is connected to a reference voltage Vref. The source of output transistor 12 is connected by conductor 9B to the (+) input of output amplifier 10 and to one terminal of a source follower resistor 14, the other terminal of which is connected by conductor 16 to reference voltage Vref. Output amplifier 10 can be a programmable gain amplifier or an instrumentation amplifier.

Current shunt amplifier 1A typically uses an emitter-coupled or source-coupled pair of input transistors to amplify the differential input voltage across shunt resistor 5. This topology needs four operational modes (two directions of the shunt current $I_{SHUNT}$, each direction being associated with a high common mode input voltage and a low common-mode input voltage) in order to accommodate all possible input conditions and to meet requirements such as bidirectional shunt current flow and wide common mode range. The output signal Vout on conductor 17 requires programmable gain amplifier (PGA) 10 to have a very low common mode input voltage. These requirements necessitate an undesirably large die size for implementation of current shunt amplifier 1A. Another drawback of current shunt amplifier 1A is that its circuitry does not function well when the differential input voltage across shunt resistor 5 is near 0 volts.

Figure 2:
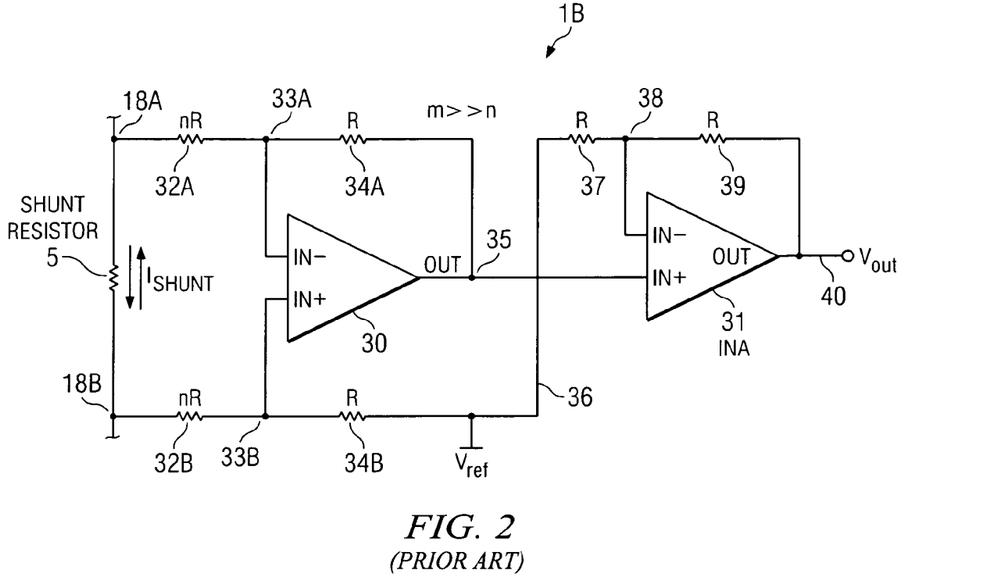
FIG. 2 is a schematic diagram of another prior art current shunt amplifier.

In Prior Art FIG. 2, the illustrated current shunt amplifier 1B measures the voltage produced across external shunt resistor 5. Current shunt amplifier 1B includes a front end stage including an operational amplifier 30, input resistors 32A and 32B, and feedback resistors 34A and 34B connected as shown. The output stage includes an instrumentation amplifier 31 having its (+) input connected to the output 35 of the foregoing front end stage and its (−) input coupled by a gain resistor 37 to a reference voltage Vref and by feedback resistor 39 to Vout. The front end stage provides a fractional gain (i.e., a gain much less than 1 (e.g., 0.02)) to enable it to have a wide common mode input voltage range. Instrumentation amplifier 31 has a very large gain. Then, if shunt resistor 5 is at a very high voltage, e.g. 200 volts, which is far beyond the operational range of operational amplifier 30, large values of input resistors 32A and 32B can reduce the voltages applied to the (−) and (+) inputs of operational amplifier 30, greatly reducing its gain. However, a high compensating gain can be provided by instrumentation amplifier 31. Unfortunately, current shunt amplifier 1B of Prior Art FIG. 2 has the drawbacks of high noise and large die size.

Figure 3:
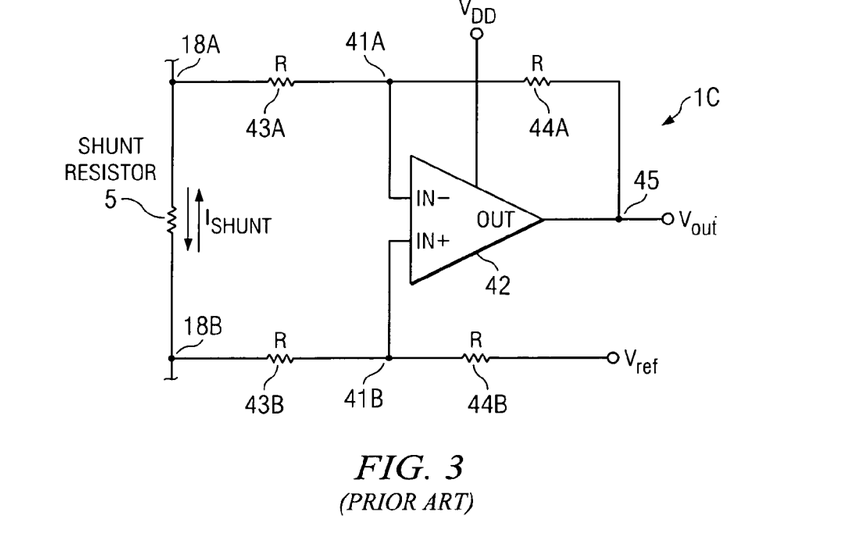
FIG. 3 is a schematic diagram of another prior art current shunt amplifier.

Prior Art FIG. 3 shows a simple form of an instrumentation amplifier 1C having essentially the same topology as that of the front end stage of Amplifier 1B shown in Prior Art FIG. 2. Instrumentation amplifier 1C is connected to measure the voltage produced across external shunt resistor 5. The topology of instrumentation amplifier 1C has two major problems, the first being that the CMRR (common mode rejection ratio) is heavily dependent on the matching of the various resistor ratios. The second problem is that the common mode input range (CMIR) is limited by VDD, as is also the case for the shunt amplifiers of FIGS. 1 and 2. The CMIR is from ground to $V_{DD}$.

Thus, there is an unmet need for a current shunt amplifier having a common mode input voltage range which extends substantially beyond the power supply voltage.

There also is an unmet need for a current shunt amplifier having a common mode input voltage range which extends substantially beyond the power supply voltage and which also is capable of bidirectional input current shunt measurements.

There also is an unmet need for a current shunt amplifier having a common mode input voltage range which extends substantially beyond the power supply voltage and which also is completely operational when the common mode input voltage is at zero or ground volts.

There also is an unmet need for a single stage current shunt amplifier having a common mode input voltage range which extends substantially beyond the power supply voltage.

There also is an unmet need for a current shunt amplifier having a common mode input voltage range which extends substantially beyond the power supply voltage and which also provides high accuracy current measurement without trimming of circuit components such as resistors.

SUMMARY OF THE INVENTION

It is an object of the invention to provide a current shunt amplifier having a common mode input voltage range which extends substantially beyond the power supply voltage.

It is another object of the invention to provide a current shunt amplifier having a common mode input voltage range which extends substantially beyond the power supply voltage and which also is capable of bidirectional input current shunt measurements.

It is another object of the invention to provide a current shunt amplifier having a common mode input voltage range which extends substantially beyond the power supply voltage and which also is completely operational when the common mode input voltage is at zero or ground volts.

It is another object of the invention to provide a single stage current shunt amplifier having a common mode input voltage range which extends substantially beyond the power supply voltage.

It is another object of the invention to provide a current shunt amplifier having a common mode input voltage range which extends substantially beyond the power supply voltage and which also provides high accuracy current measurement without trimming of circuit components such as resistors.

Briefly described, and in accordance with one embodiment, the present invention provides a differential amplifier (1D) includes circuitry (5,R1,R2,52) coupling a common mode component of an input voltage (Vin⁺−Vin⁻) to a maximum voltage selector circuit (53) that produces an internal voltage ($V_{RAIL-TOP}$) equal to the larger of a first supply voltage ($V_{DD}$ or $V_{REG}$) and the common mode component. An input amplifier circuit (46) of the differential amplifier is powered by the internal voltage. The input voltage (Vin⁺−Vin⁻) is coupled to inputs (41A,B) of the input amplifier circuit (46). Outputs (64A,B) of the input amplifier circuit (46) are amplified by an output amplifier (50).

In one embodiment, the invention provides an amplifier (1D) for measuring a differential input voltage (Vin⁺−Vin⁻) over a wide range of common mode input voltages including coupling circuitry (R1,R2) which receives the differential input voltage (Vin⁺−Vin⁻) and produces a voltage representative of a common mode voltage component of the differential input voltage. A maximum voltage selector circuit (53) is coupled to receive a first supply voltage ($V_{DD}$ or $V_{REG}$) and the voltage representative of the common-mode voltage component, for producing a first internal rail voltage ($V_{RAIL-TOP}$) which is equal to the larger of the first supply voltage ($V_{DD}$ or $V_{REG}$) and the voltage representative of the common-mode voltage component. An input amplifier circuit (46) has inputs (41A,B) coupled to receive the differential input voltage (Vin⁺−Vin⁻) and outputs (64A,B) coupled to inputs of an output amplifier (50) which produces a second output voltage (Vout). The input amplifier circuit (46) is powered by the first internal rail voltage ($V_{RAIL-TOP}$).

In a described embodiment, the amplifier (1D) is a shunt amplifier and the differential input voltage (Vin⁺−Vin⁻) is a voltage produced across a shunt resistor ($R_{SHUNT}$) by a shunt current ($S_{HUNT}$), the coupling circuitry (R1,R2) including averaging circuitry (R1,R2) coupled to receive the differential input voltage (Vin⁺−Vin⁻) for producing the voltage representative of the common-mode voltage component as an averaged voltage ($V_{AVERAGE}$) representative of the common mode voltage component of the differential input voltage.

In a described embodiment, the maximum voltage selector circuit (53) includes a comparator (70) having a first input (+) coupled to receive the first supply voltage ($V_{DD}$ or $V_{REG}$) and a second input (−) coupled to receive the averaged voltage ($V_{AVERAGE}$). A first switch (S1) is coupled between the first supply voltage ($V_{DD}$ or $V_{REG}$) and an output (54) of the maximum voltage selector circuit (53) on which the first internal rail voltage ($V_{RAIL-TOP}$) is produced. A second switch (S2) is coupled between the averaged voltage ($V_{AVERAGE}$) and the output (54) on which the first internal rail voltage ($V_{RAIL-TOP}$) is produced. The comparator (70) has an output (73) coupled to open the first switch (S1) and close the second switch (S2) when the averaged voltage ($V_{AVERAGE}$) exceeds the first supply voltage ($V_{DD}$ or $V_{REG}$) and to close the first switch (S1) and open the second switch (S2) when the averaged voltage ($V_{AVERAGE}$) is less than the first supply voltage ($V_{DD}$ or $V_{REG}$).

In a described embodiment, the output (73) of the comparator (70) is coupled to a control terminal of the first switch (S1) and to an input of an inverter (74) having an output (76) coupled to a control terminal of the second switch (S2). A first level shifter (77) is coupled between the output (76) of the inverter (74) and a control terminal (78) of the second switch (S2). In a described embodiment, the first supply voltage ($V_{REG}$) is an output of a voltage regulator (71) which receives a second supply voltage ($V_{DD}$) as an input. The comparator (70) has a sufficient amount of hysteresis to avoid excessive switching of the first (S1) and second (S2) switches. A second level shifter (80,81) has a first terminal coupled to receive the first internal rail voltage ($V_{RAIL-TOP}$) and a second terminal coupled to a terminal (83) of current source (81) to produce a second internal rail voltage ($V_{RAIL-BOTTOM}$) on that terminal (83).

In a described embodiment, the input amplifier circuit (46) includes a chopper-stabilized input amplifier (42) having inputs coupled to receive the differential input voltage (Vin⁺−Vin⁻) and outputs coupled to the inputs of the output amplifier (50). A digital filter (63) is coupled between an output (61A,B) of the chopper-stabilized amplifier (58,42A,60) and the inputs of the output amplifier (50). A feed-forward amplifier (57) has inputs coupled to receive the differential input signal (Vin⁺−Vin⁻) and outputs coupled to the inputs of the output amplifier. A digital filter (63) is coupled between an output (61A,B) of the chopper-stabilized amplifier (58,42A,60) and inputs of an intermediate amplifier (66). Outputs of the intermediate amplifier (66) are coupled to the inputs of the output amplifier (50). In a described embodiment, the output amplifier (50) is powered by means of a voltage other than the first internal rail voltage ($V_{RAIL-TOP}$).

In one embodiment, the invention provides a method for measuring a differential input voltage (Vin⁺−Vin⁻) over a wide range of common mode input voltages, including coupling a voltage representative of a common mode voltage component of the differential input voltage (Vin⁺−Vin⁻) to an input of a maximum voltage selector circuit (53), producing a first internal rail voltage ($V_{RAIL-TOP}$) which is equal to the larger of a first supply voltage ($V_{DD}$ or $V_{REG}$) and the voltage representative of the common mode voltage component of the differential input voltage (Vin⁺−Vin⁻), and powering an input amplifier circuit (46) by means of the first internal rail voltage ($V_{RAIL-TOP}$), inputs (41A,B) of the input amplifier circuit (46) being coupled to receive the differential input voltage and outputs (64A,B) of the input amplifier circuit (46) being coupled to inputs of an output amplifier (50) producing a second output voltage (Vout). In a described embodiment, the method includes averaging the differential input voltage (Vin⁺−Vin⁻) to provide the voltage representative of the common mode voltage component of the differential input voltage (Vin⁺−Vin⁻) as an averaged voltage ($V_{AVERAGE}$). A first input (+) of a comparator (70) is coupled to receive the first supply voltage ($V_{DD}$ or $V_{REG}$). The method includes coupling a second input (−) of the comparator (70) to receive the averaged voltage ($V_{AVERAGE}$), and operating both a first switch (S1) coupled between the first supply voltage ($V_{DD}$ or $V_{REG}$) and a conductor (54) on which the first internal rail voltage ($V_{RAIL-TOP}$) is produced and a second switch (S2) coupled between the averaged voltage ($V_{AVERAGE}$) and the conductor (54) on which the first internal rail voltage ($V_{RAIL-TOP}$) is produced to switch in response to the comparator (70) so as to open the first switch (S1) and close the second switch (S2) when the averaged voltage ($V_{AVERAGE}$) exceeds the first supply voltage ($V_{DD}$ or $V_{REG}$) and to close the first switch (S1) and open the second switch (S2) when the averaged voltage ($V_{AVERAGE}$) is less than the first supply voltage ($V_{DD}$ or $V_{REG}$).

In one embodiment, the invention provides an amplifier (1D) for measuring a differential input voltage (Vin⁺−Vin⁻) over a wide range of common mode input voltages, including means (5,R1,R2,52) for coupling a voltage representative of a common mode voltage component of the differential input voltage (Vin$^+$−Vin$^-$) to an input of a maximum voltage selector circuit (53), means (53) for producing a first internal rail voltage (V$_{RAIL-TOP}$) which is equal to the larger of a first supply voltage (V$_{DD}$ or V$_{REG}$) and the voltage representative of the common mode voltage component of the differential input voltage (Vin$^+$−Vin$^-$), and means (54) for powering an input amplifier circuit (46) by means of the first internal rail voltage (V$_{RAIL-TOP}$), inputs (41A,B) of the input amplifier circuit (46) being coupled to receive the differential input voltage (Vin$^+$−Vin$^-$) and outputs (64A,B) of the input amplifier circuit (46) being coupled to inputs of an output amplifier (50) producing a second output voltage (Vout).

DETAILED DESCRIPTION OF THE PREFERRED EMBODIMENTS

The present invention extends the common mode input range of a current shunt amplifier beyond the power supply voltage by utilizing the common mode input voltage to power the input stage, allowing electrical "floating" of a low voltage amplifier in the input stage.

Figure 4:
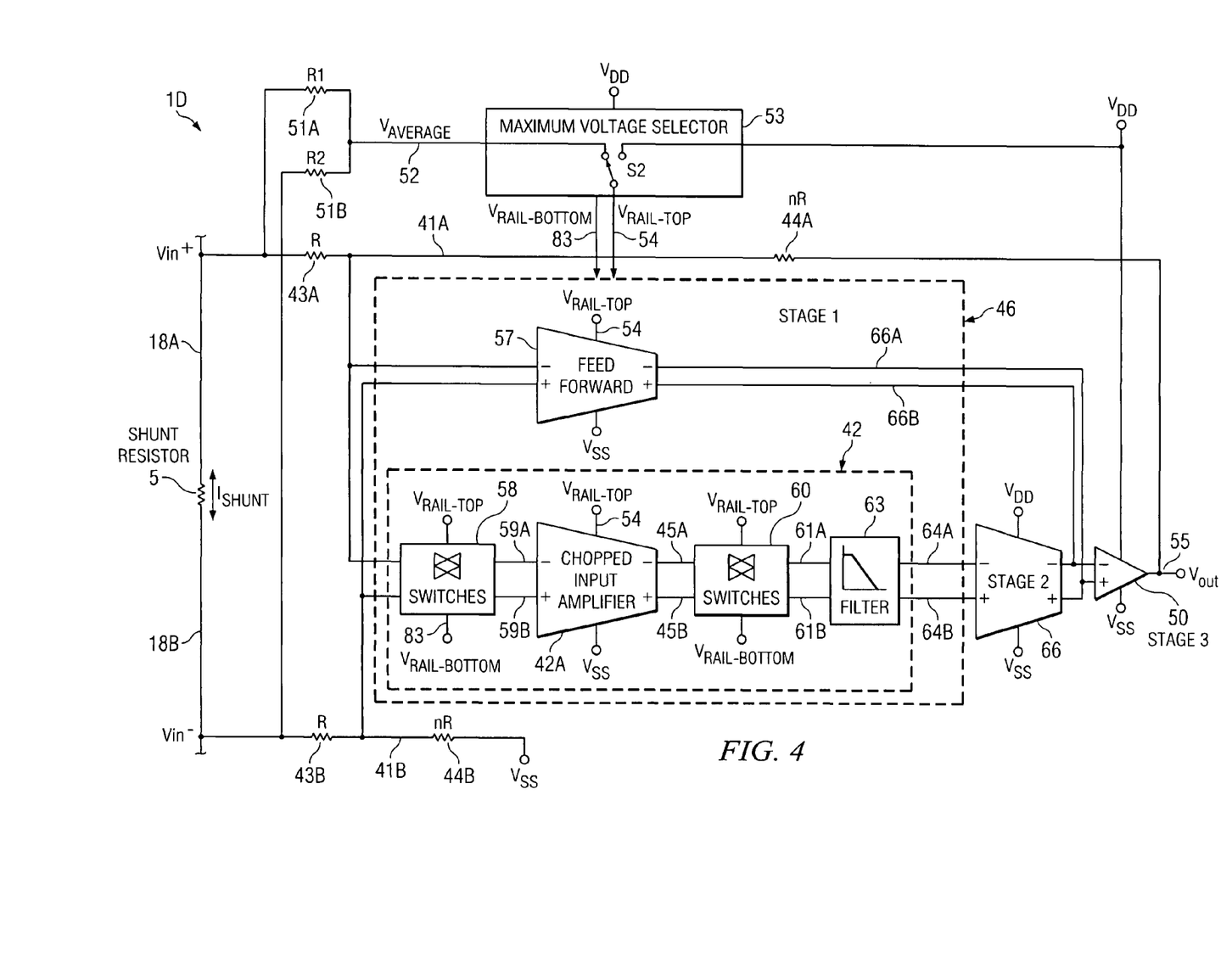
FIG. 4 is a block diagram of a current shunt amplifier of the present invention.

Referring to FIG. 4, current shunt amplifier 1D measures the voltage Vin$^+$−Vin$^-$ produced between the terminals 18B and 18A of external shunt resistor 5 in response to a shunt current I$_{SHUNT}$, and includes a first or "front end" stage input pre-amplifier 46, a conventional second stage amplifier 66, and a conventional third or output stage amplifier 50. First stage input pre-amplifier 46 includes a chopper-stabilized input amplifier 42 which includes input amplifier 42A and its associated input chopping switches 58, its associated output chopping switches 60, and a digital filter 63. Input amplifier 42A has its (−) and (+) inputs coupled by means of conductors 59A and 59B, respectively, to outputs of chopping switches 58, the inputs of which are connected to conductors 41A and 41B. The (−) and (+) outputs of chopper-stabilized input amplifier 42A are connected by conductors 45A and 45B, respectively, to inputs of output chopping switches 60. The outputs of chopping switches 60 are connected by conductors 61A and 61B to the input terminals of a digital filter 63, which is used to filter out the switching (chopping) noise. Digital filter 63 is a combination low pass and notch filter having a notch at the switching frequency. The outputs of digital filter 63 are connected by conductors 64A and 64B to the (−) and (+) inputs of second stage amplifier 66. The (−) and (+) outputs of second stage amplifier 66 are connected to the (−) and (+) inputs input output (third stage) amplifier 56 which produces an output voltage Vout on conductor 55. Second stage amplifier 66 is essentially an operational amplifier, quite similar to the assignee's OPA333 operational amplifier.

First stage input pre-amplifier 46 also includes a feed-forward amplifier 57 having its (−) input connected to conductor 41A and its (+) input connected to conductor 41B. Feed-forward amplifier 57 can be implemented by means of any of a number of conventional operational amplifiers. The (−) and (+) inputs of conventional output buffer amplifier 50 are also connected to the (−) and (+) outputs of feed-forward amplifier 57, respectively, by means of conductors 66A and 66B, respectively. Feed-forward amplifier 57 stage helps to improve the stability of chopper-stabilized first stage input pre-amplifier 46. The fast feed-forward path through feed-forward amplifier 57 is in parallel with the main slow, low offset, high gain signal path through chopper-stabilized input amplifier 42, and the two foregoing signal paths are combined at the input of the output buffer amplifier 50. The main signal path dominates at lower frequencies and the feed-forward signal path takes control at higher signal frequencies.

The resistance of shunt resistor 5 usually less than 1 ohm, but can be greater as long as the voltage drop is within the range of 250 micro-ohms to 1.0 ohms. Larger or smaller shunt resistance values might be used in applications with either very large or extremely small currents. The upper terminal 18A of shunt resistor 5 is connected to one terminal of input resistor 43A and to one terminal of resistor 51A. The lower terminal 18B of shunt resistor 5 is connected to one terminal of input resistor 43B and to one terminal of resistor 51B. The other terminal of input resistor 43A is connected to conductor 41A. The other terminal of input resistor 43B is connected to conductor 41B. A resistor 44A is connected between conductor 41A and Vout. A resistor 44B is connected between conductor 41B and a reference voltage, which can be V$_{SS}$. (It should be appreciated that the common mode voltage of shunt resistor 5 could be coupled to conductor 52 by either of resistors 51A or 51B if the other resistor is omitted.)

Input resistors 43A and 43B have a resistance R and resistors 44A and 44B each have a resistance nR. Suitable values of R may be in the range of, for example, 100 ohms to 100 kilohms. (Values less than 100 ohms can affect the current measurement, and values greater than 100 kilohms do not provide sufficient current to effectively power input pre-amplifier 46.) Suitable values of n may be in the range of, for example, 10 ohms to 1000 ohms. The high-side supply voltage terminals of second stage input pre-amplifier 46 are connected to V$_{RAIL-TOP}$, which is produced on conductor 54 by maximum voltage selector circuit 53. The high-side supply voltage terminals of output buffer amplifier 50 are connected to VDD. The low-side supply voltage terminals of both input pre-amplifier 46 and output buffer amplifier 50 are connected to V$_{SS}$.

The high-side supply voltage terminals of input amplifier 42, including chopper-stabilized input amplifier 42 and feed-forward amplifier 57, are connected to a voltage V$_{RAIL-TOP}$ produced on conductor 54 by a maximum voltage selector circuit 53. The low-side supply voltage terminals of input amplifier 42A and feed-forward amplifier 57, are connected to a voltage V$_{SS}$ (or possibly the voltage V$_{RAIL-BOTTOM}$ produced on conductor 83 by maximum voltage selector circuit 53). The high-side supply voltage terminals of second stage amplifier 66 and third stage amplifier 50 are connected to V$_{DD}$. (V$_{RAIL-TOP}$ and V$_{RAIL-BOTTOM}$ may be connected to isolation rings (not shown) around chopper switches 58 and 64 some integrated circuit manufacturing processes, while in other manufacturing processes the voltages $V_{RAIL-TOP}$ and $V_{RAIL-BOTTOM}$ might not be used for this purpose.)

The high-side supply voltage terminal of maximum voltage selector circuit 53 is connected to $V_{DD}$. The input of maximum voltage selector circuit 53 is connected by conductor 52 to one terminal of each of resistors 51A and 51B, which have resistances of R1 and R2, respectively. The other terminal of resistor 51A is connected to shunt resistor terminal 18A and the other terminal of resistor 51B is connected to shunt resistor terminal 18B. Suitable values of R1 and R2 may be in the range of about 100 ohms to about 10 kilohms. (The value of resistors R1 and R2 may be as low as 100 ohms as long as the resistance of shunt resistor 5 is very small (e.g., less than 0.1 ohm). Otherwise such a low value of resistors R1 and R2 will reduce the amplifier accuracy.)

The voltage $V_{AVERAGE}$ on conductor 52 is generated in accordance with the values of the voltages on conductors 18A and 18B and the values of resistors R1 and R2, which are chosen to be sufficiently small that they do not significantly impact the accuracy of the measurement of the voltage across shunt resistor 5. The voltage $V_{AVERAGE}$ tracks the common mode input voltage across a shunt resistor 5

Maximum voltage selector circuit 53 powers input stage amplifier 42 and output amplifier stage 50 from $V_{DD}$ when $V_{DD}$ is greater than $V_{AVERAGE}$. When $V_{AVERAGE}$ exceeds $V_{DD}$, input stage pre-amplifier 46 is powered by the common mode voltage of shunt resistor 5, which is equal to $V_{AVERAGE}$. This allows the differential input voltage applied between the (−) and (+) inputs of amplifier 42 to track the common mode voltage on shunt resistor 5. The above mentioned CMIR limitations normally associated with lower values of $V_{DD}$ are avoided by shunt amplifier 1D of FIG. 4 because of the technique described herein to power the input pre-amplifier 46 from either $V_{DD}$ or the common mode voltage $V_{AVERAGE}$ of shunt resistor 5. Maximum voltage selector circuit 53 can be implemented in a variety of ways, as indicated in subsequently described FIGS. 5A-E. It should be appreciated that without maximum voltage selector 53, the circuit shown in FIG. 4 is essentially just a chopper-stabilized operational amplifier that includes a digital filter.

Figures 5A, 5B:
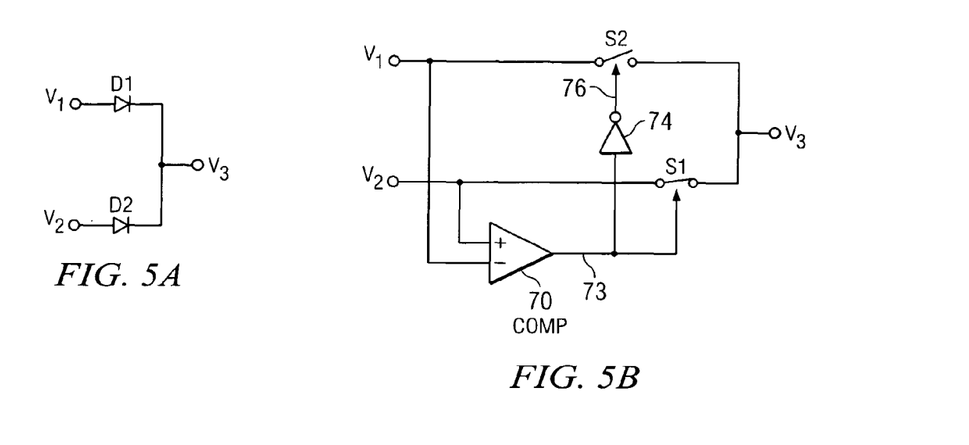
FIG. 5A is a simplified conceptualized diagram useful in explaining maximum voltage selector circuit 53 of FIG. 5.
FIG. 5B is a simplified block diagram useful in explaining maximum voltage selector circuit 53 of FIG. 5.

FIG. 5A shows a circuit that could implement the basic function of maximum voltage selector 53 of FIG. 4 if the forward voltage drops across diodes D1 and D2 are negligible. The one of voltages V1 and V2 which is greater forward biases its associated diode D1 or D2. Therefore, the greater of V1 and V2 minus the associated forward diode voltage drop is equal to V3.

FIG. 5B is a generalized diagram of a more practical circuit that could be used to implement maximum voltage selector 53. In FIG. 5B, V1 is applied to one terminal of a switch S2 and to the (−) input of a comparator 70. V2 is applied to one terminal of switch S1 and to the (+) input of comparator 70. The other terminal of each of switches S1 and S2 is connected to V3. The output 73 of comparator 70 is applied to a control terminal of switch S1 and to the input of inverter 74, the output of which is connected to a control terminal of switch S2. The maximum selected voltage V3 therefore is equal to the larger of V1 and V2.

Figure 5C:
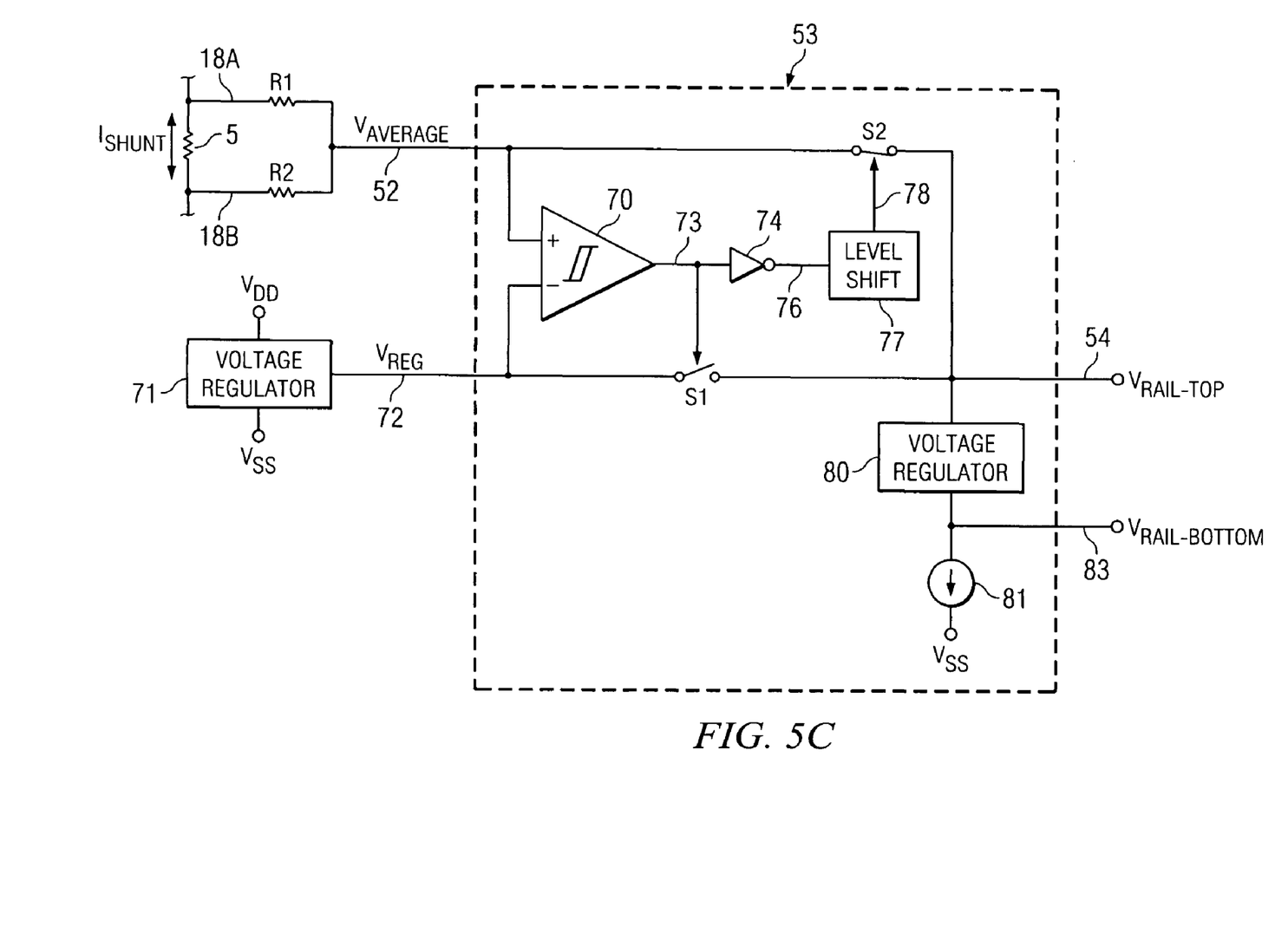
FIG. 5C is detailed block diagram of a maximum voltage selector circuit 53 of FIG. 5.

FIG. 5C is a block diagram of a practical implementation of maximum voltage selector 53, and is based on the circuit in FIG. 5B. In FIG. 5C, the voltage V1 is the voltage $V_{AVERAGE}$ produced by resistors R1 and R2 and the voltages on shunt resistor terminals 18A and 18B in FIGS. 4 and 5C. The voltage V2 is the voltage $V_{REG}$ produced by a voltage regulator 71, and V3 is the output voltage $V_{RAIL-TOP}$ produced on conductor 54 by maximum voltage selector 53 in FIG. 5C. In FIG. 5C, voltage regulator 71 is a linear voltage regulator coupled between $V_{DD}$ and $V_{SS}$ (or ground) and produces a regulated voltage $V_{REG}$, which may, for example, be 2.5 volts. Comparator 70 has a sufficient amount of hysteresis to prevent rapid switching if $V_{AVERAGE}$ and $V_{REG}$ are nearly equal. The output 73 of comparator 70 directly controls switch S1 and causes inverter 74 to produce the opposite logic level on conductor 76. Level shift circuit 77 shifts the logic level voltage on conductor 76 to a sufficiently higher logic level voltage on conductor 78 so as to properly control switch S2 if the common mode voltage on shunt resistor 5 is much higher than $V_{DD}$ and $V_{REG}$. The input and output of voltage regulator 80 are connected to conductors 54 and 83, respectively. Conductor 83 also is connected to current source 81, and the voltage $V_{RAIL-BOTTOM}$ is produced on conductor 83. Regulator 80 and current source 81 together form a level shifter between $V_{RAIL-TOP}$ and $V_{RAIL-BOTTOM}$. Voltage regulator 80 can be a simple voltage regulator or a linear regulator. In any case, the connection of current source 81 to regulator 80 allows regulator 80 to shift or "float" with shunt resistor 5 when $V_{RAIL-TOP}$ is at a voltage greater than $V_{REG}$.

If the value of $V_{AVERAGE}$ is greater than $V_{REG}$, comparator 70 produces a "0" on conductor 73 which opens switch S1 and causes inverter 74 to produce a "1" on conductor 76. That "1" is shifted by level shifter 77 to a suitable voltage level to close switch S2, causing $V_{RAIL-TOP}$ to be equal to $V_{AVERAGE}$. If $V_{AVERAGE}$ is less than $V_{REG}$, then comparator 70 produces a "1" on conductor 73 which to close S1 and causes inverter 74 to produce a "0" on conductor 76, causing switch S2 to be opened. This causes $V_{RAIL-TOP}$ to be equal to $V_{REG}$. In either case, $V_{RAIL-BOTTOM}$ is equal to $V_{RAIL-TOP}$ minus the constant voltage drop across voltage regulator 80.

Figure 5D:
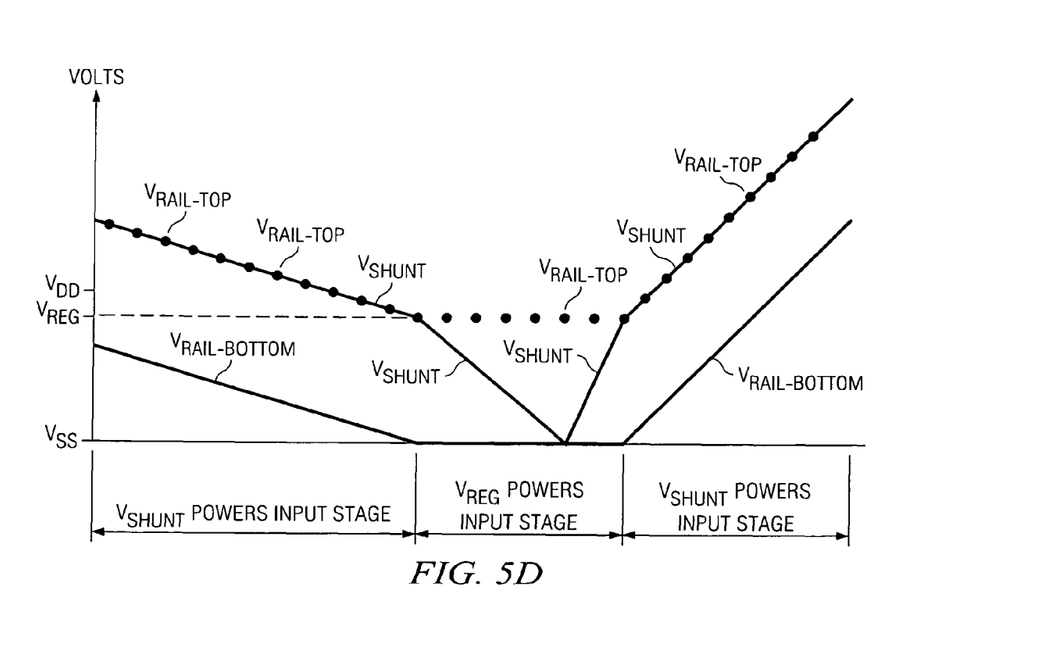
FIG. 5D is a graph useful explaining the operation of the shunt amplifier of FIG. 5.
Figure 5E:
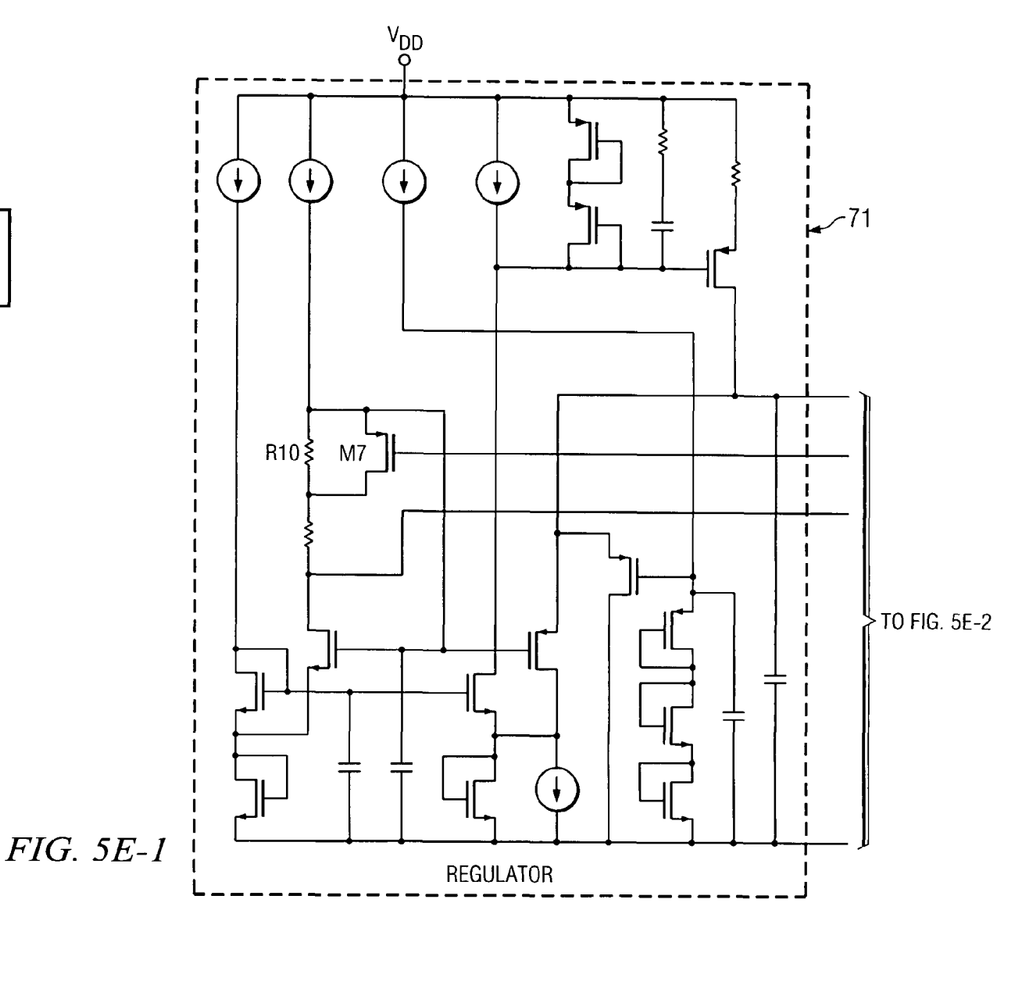
FIG. 5E is a detailed schematic diagram of one implementation of maximum voltage selector circuit 53 of FIG. 5.

This operation is illustrated in the graph of FIG. 5D. FIG. 5D shows $V_{RAIL-TOP}$ "following" the common mode voltage $V_{SHUNT}$ of the shunt resistor 5 either down to $V_{REG}$ or following $V_{SHUNT}$ upward from $V_{REG}$. As $V_{AVERAGE}$ increases above $V_{REG}$, the supply voltages $V_{RAIL-TOP}$ and $V_{RAIL-BOTTOM}$ both track $V_{AVERAGE}$, which is in essence the common mode voltage of shunt resistor 5.

Figure 5E:
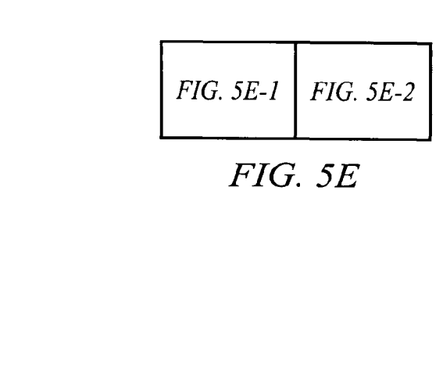
Figure 5E:
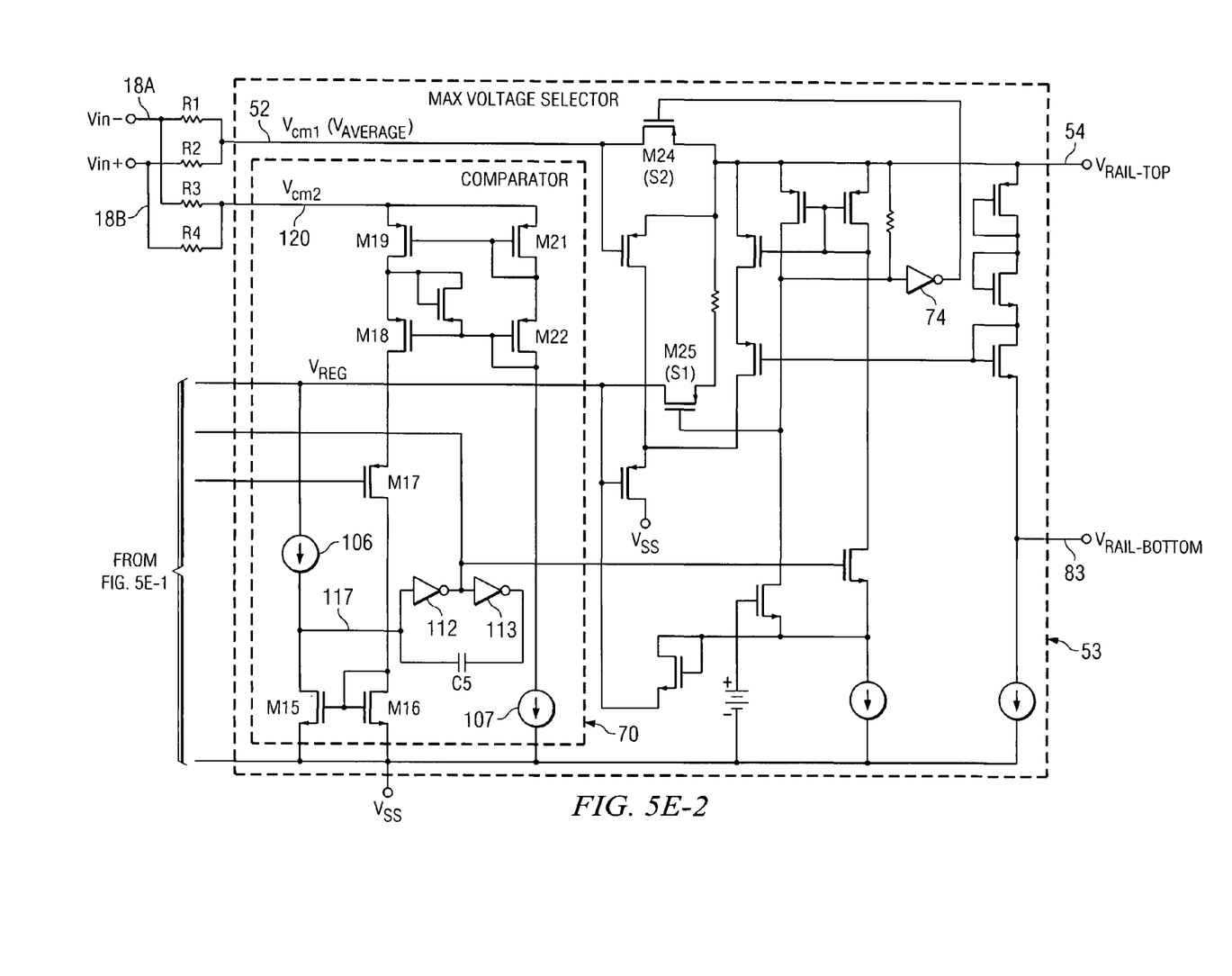

FIG. 5E shows a schematic diagram of maximum voltage selector 53 of FIG. 5C. Regulator 71 can be a conventional voltage regulator, an example of which is shown in block 71, and provides $V_{REG}$, for an example as a regulated 2.5 volts. Comparator 70 of FIG. 5C can be implemented in various ways, one of which is shown in block 70 of FIG. 5E, and compares $V_{REG}$ and $V_{AVERAGE}$. In comparator 70 as shown in FIG. 5E, the current mirrored by current mirror transistors M15 and M16 is compared with the current supplied by current source 106, causing the logic level on conductor 117 to rise or fall. Both AC and DC hysteresis are provided by comparator 70, by means of resistors R10, R11, transistor M7, current source 106, transistors M15, M16, M17, M18, M19, M20, M21, M22, current source 107, capacitor C5, and inverters 112 and 113. This circuitry provides a cleaner transition between regulator 71 and the common mode voltage $V_{SHUNT}$ of shunt resistor 5, and is helpful but not essential. Transistor M7 and resistor R10 provide the DC hysteresis, and capacitor C5 provides the AC hysteresis. The DC hysteresis, which can be roughly 60 millivolts, is realized by shorting/unshorting resistor R10 to thereby adjust the hysteresis threshold. If resistors R1 and R2 are equal, then the average value $V_{AVERAGE}$ is the same as the voltage Vcm1 on conductor 52. The voltage Vcm2 produced on conductor 120 by resistors R3 and R4 is can be large during a large, fast transition of the common mode voltage of shunt resistor 5. This arrangement allows shunt amplifier 1D (FIG. 4) to tolerate a large differential voltage across shunt resistor 5, and prevents the voltage drop across resistors R1 and R2 from causing undesirable negative hysteresis.

Figure 6:
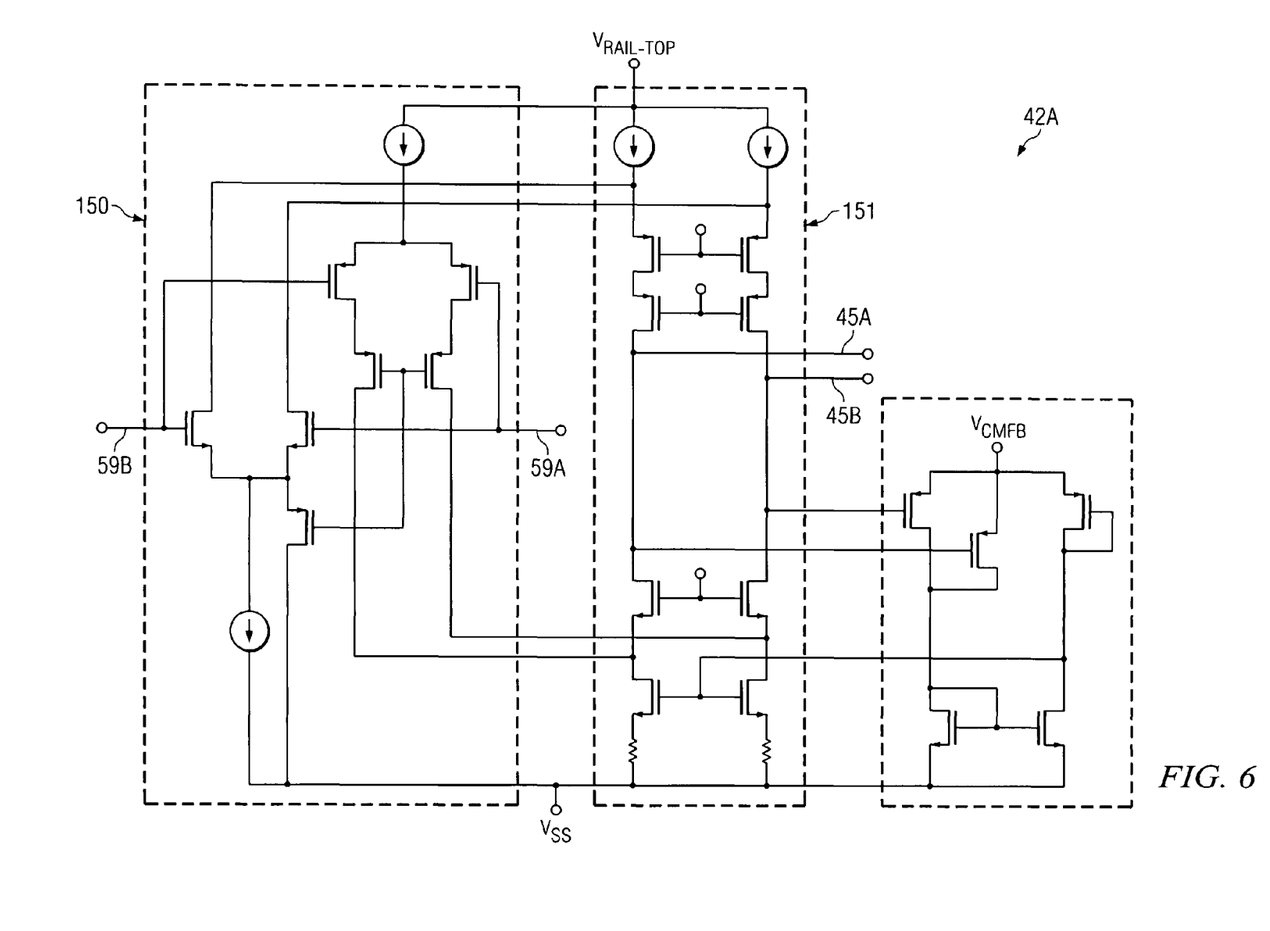
FIG. 6 is a schematic diagram of one implementation of input amplifier 42 of FIG. 5.

Amplifier 42A of FIG. 4 can be implemented by means of any of a number of conventional operational amplifiers, one of which is shown in FIG. 6, having a conventional differential front end circuit 150 followed by a conventional folded cascode circuit 151, with a conventional common mode feedback circuit 152. The high-side supply voltage terminal of amplifier 42A is connected to $V_{RAIL-TOP}$, and the low-side supply voltage terminal is connected to $V_{SS}$.

The major differences between chopper-stabilized operational amplifier 42A in FIG. 4 and a general chopper-stabilized operational amplifier are as follows. First, the supply voltage $V_{RAIL-TOP}$ applied to chopper-stabilized amplifier 42 is the higher of the input common-mode voltage $V_{AVERAGE}$ and 2.5 volts, wherein the 2.5 volts is provided by a subregulator, as indicated in above described FIG. 5C. The ratio between the common mode input voltage of input pre-amplifier 46 and $V_{AVERAGE}$ is determined by the values of resistances R1 and R2, and that common mode input voltage is equal to $V_{AVERAGE}$ are equal if resistances R1 and R2 are equal. Chopper-stabilized amplifier 42 does not need to be unity gain stable because the resistor divider feedback causes chopper-stabilized amplifier 42 to have a gain greater than unity, and the bandwidth of chopper-stabilized amplifier 42 can be increased without causing instability problem. The use of a substantial amount of voltage cascoding and clamp circuitry, as shown in subsequently described FIG. 6, avoids voltage breakdown in various MOS transistors.

The present invention allows the user to measure the voltages across shunt resistors that are at or slightly below (i.e., up to 0.2 volts below) ground voltage and also allows the common mode input voltages to be much higher than $V_{DD}$. None of the prior art shunt amplifiers have this capability. The described embodiment of the invention also is capable of taking accurate measurements of the voltage across shunt resistors which are at common-mode input voltages substantially higher than is possible in the prior art shunt amplifiers. That is accomplished by using the maximum voltage selector circuit 53. The comparator with hysteresis will turn on either switch S1 or S2, depending on which of $V_{AVERAGE}$ and $V_{REG}$ is greater. The voltage on conductor 54 is used to power the regulator between Vrail-top and Vrail-bottom. Where the shunt voltage is indicated by the dashed line, the shunt voltage starts to exceed $V_{REG}$, then that regulator starts electrically floating. When that regulator starts floating, a voltage equal to $V_{RAIL-TOP}$ minus $V_{RAIL-BOTTOM}$ functions as the as the supply voltage for chopper-stabilized input pre-amplifier 46. A main reason for using the input switches of the chopper-stabilized input pre-amplifier 46 was to achieve very low input offset voltage of the shunt amplifier 53.

In contrast to the prior art, current shunt circuit 1D of FIG. 4 is not highly limited by the limitations placed on input pre-amplifier 46 as a result of the value of the supply voltage $V_{DD}$.

The current shunt amplifier 1D of FIG. 4 overcomes the drawbacks of the above mentioned prior art current shunt amplifiers and provides a simpler shunt current amplifier with better performance than the prior art.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, in some cases a standard non-chopper-stabilized 3-stage amplifier with an electrically floating input stage could be used, although the described chopper-stabilized input pre-amplifier 46 has better noise performance compared to other amplifiers, for example amplifiers using auto-zero circuitry.

What is claimed is:

1. An amplifier for measuring a differential input voltage over a wide range of common mode input voltages, comprising:
    coupling circuitry coupled to receive the differential input voltage for producing a voltage representative of a common mode voltage component of the differential input voltage;
    a maximum voltage selector circuit coupled to receive a first supply voltage and the voltage representative of the common-mode voltage component for producing a first internal rail voltage which is equal to the larger of the first supply voltage and the voltage representative of the common-mode voltage component; and
    an input amplifier circuit having inputs coupled to receive the differential input voltage and outputs coupled to inputs of an output amplifier producing an output voltage, the input amplifier circuit being powered by the first internal rail voltage.

2. The amplifier of claim 1, wherein the amplifier is a shunt amplifier and the differential input voltage is a voltage produced across a shunt resistor by a shunt current, the coupling circuitry including averaging circuitry coupled to receive the differential input voltage for producing the voltage representative of the common-mode voltage component as an averaged voltage representative of the common mode voltage component of the differential input voltage.

3. The amplifier of claim 1, wherein the maximum voltage selector circuit includes a comparator having a first input coupled to receive the first supply voltage and a second input coupled to receive an averaged voltage, a first switch coupled between the first supply voltage and an output of the maximum voltage selector circuit on which the first internal rail voltage is produced, and a second switch coupled between the averaged voltage and the output on which the first internal rail voltage is produced, the comparator having an output coupled to open the first switch and close the second switch when the averaged voltage exceeds the first supply voltage and to close the first switch and open the second switch when the averaged voltage is less than the first supply voltage.

4. The amplifier of claim 3, wherein the output of the comparator is coupled to a control terminal of the first switch and to an input of an inverter having an output coupled to a control terminal of the second switch.

5. The amplifier of claim 4, including a first level shifter coupled between the output of the inverter and a control terminal of the second switch.

6. The amplifier of claim 3, wherein the first supply voltage is an output of a voltage regulator which receives a second supply voltage as an input.

7. The amplifier of claim 5, wherein the first supply voltage is an output of a voltage regulator which receives a second supply voltage as an input.

8. The amplifier of claim 3, wherein the comparator has a sufficient amount of hysteresis to avoid excessive switching of the first and second switches.

9. The amplifier of claim 3, including a second level shifter having a first terminal coupled to receive the first internal rail voltage and a second terminal coupled to a terminal of current source to produce a second internal rail voltage on that terminal.

10. The amplifier of claim 9, wherein the input amplifier circuit includes an input amplifier having inputs coupled to receive the differential input voltage and outputs coupled to the inputs of the output amplifier.

11. The amplifier of claim 10, wherein the input amplifier includes a chopper-stabilized amplifier.

12. The amplifier of claim 11, wherein the input amplifier includes a digital filter coupled between an output of the chopper-stabilized amplifier and at least one of the inputs of the output amplifier.

13. The amplifier of claim 10, including a feed-forward amplifier having inputs coupled to receive the differential input signal and outputs coupled to the inputs of the output amplifier.

14. The amplifier of claim 13, including an intermediate amplifier, a digital filter being coupled between an output of a chopper-stabilized amplifier and inputs of the intermediate amplifier, outputs of the intermediate amplifier being coupled to the inputs of the output amplifier.

15. The amplifier of claim 1, wherein the output amplifier is powered by means of a voltage other than the first internal rail voltage.

16. A method for measuring a differential input voltage over a wide range of common mode input voltages, the method comprising:
coupling a voltage representative of a common mode voltage component of the differential input voltage to an input of a maximum voltage selector circuit;
producing a first internal rail voltage which is equal to the larger of a first supply voltage and the voltage representative of the common mode voltage component of the differential input voltage; and
powering an input amplifier circuit by means of the first internal rail voltage, inputs of the input amplifier circuit being coupled to receive the differential input voltage and outputs of the input amplifier circuit being coupled to inputs of an output amplifier producing an output voltage.

17. The method of claim 16, wherein the step of coupling includes averaging the differential input voltage to provide the voltage representative of the common mode voltage component of the differential input voltage as an averaged voltage, and wherein the step of producing includes coupling a first input of a comparator to receive the first supply voltage and coupling a second input of the comparator to receive the averaged voltage, and operating both a first switch coupled between the first supply voltage and a conductor on which the first internal rail voltage is produced and a second switch coupled between the averaged voltage and the conductor on which the first internal rail voltage is produced to switch in response to the comparator so as to open the first switch and close the second switch when the averaged voltage exceeds the first supply voltage and to close the first switch and open the second switch when the averaged voltage is less than the first supply voltage.

18. The method of claim 16, including powering the output amplifier by means of a voltage other than the first internal rail voltage.

19. The method of claim 16, coupling inputs of a feed-forward amplifier to receive the differential input signal and coupling outputs of the feed-forward amplifier to the inputs of the output amplifier.

20. An amplifier for measuring a differential input voltage over a wide range of common mode input voltages, comprising:
means coupling a voltage representative of a common mode voltage component of the differential input voltage to an input of a maximum voltage selector circuit;
means for producing a first internal rail voltage which is equal to the larger of a first supply voltage and the voltage representative of the common mode voltage component of the differential input voltage; and
means for powering an input amplifier circuit by means of the first internal rail voltage, inputs of the input amplifier circuit being coupled to receive the differential input voltage and outputs of the input amplifier circuit being coupled to inputs of an output amplifier producing an output voltage.

* * * * *